(12) United States Patent
Test

(10) Patent No.: US 6,869,875 B2
(45) Date of Patent: Mar. 22, 2005

(54) METHOD TO ACHIEVE CONTINUOUS HYDROGEN SATURATION IN SPARINGLY USED ELECTROLESS NICKEL PLATING PROCESS

(75) Inventor: Howard R. Test, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/635,825

(22) Filed: Aug. 6, 2003

(65) Prior Publication Data

US 2004/0084511 A1 May 6, 2004

Related U.S. Application Data

(63) Continuation of application No. 10/122,064, filed on Apr. 15, 2002, now Pat. No. 6,616,967.

(51) Int. Cl.[7] .............................................. H01L 21/44
(52) U.S. Cl. ....................... 438/678; 437/437; 437/438; 437/304; 437/305; 438/761; 438/758
(58) Field of Search ................................. 438/678, 687, 438/758, 761; 427/98, 404, 405, 437, 438, 443.1, 436, 304, 305

(56) References Cited

U.S. PATENT DOCUMENTS

| 6,616,967 B1 | * | 9/2003 | Test | ............................. 427/98 |
| 2001/0033020 A1 | | 10/2001 | Stierman et al. | |
| 2001/0035452 A1 | | 11/2001 | Test et al. | |

FOREIGN PATENT DOCUMENTS

| JP | 2001-107254 | | 4/2001 | |
| JP | 2001-107254 A | * | 4/2001 | ........... C23C/18/18 |

* cited by examiner

Primary Examiner—Shrive P. Beck
Assistant Examiner—David Turocy
(74) Attorney, Agent, or Firm—Yingsheng Tung; Wade James Brady, III; Frederick J. Telecky, Jr.

(57) ABSTRACT

An improved wire bonding process for copper-metallized integrated circuits is provided by a nickel layer that acts as a barrier against up-diffusing copper. In accordance with the present invention the nickel bath is placed and remains in hydrogen saturation by providing a piece of metal that remains in the nickel plating tank before and during the plating process.

7 Claims, 3 Drawing Sheets

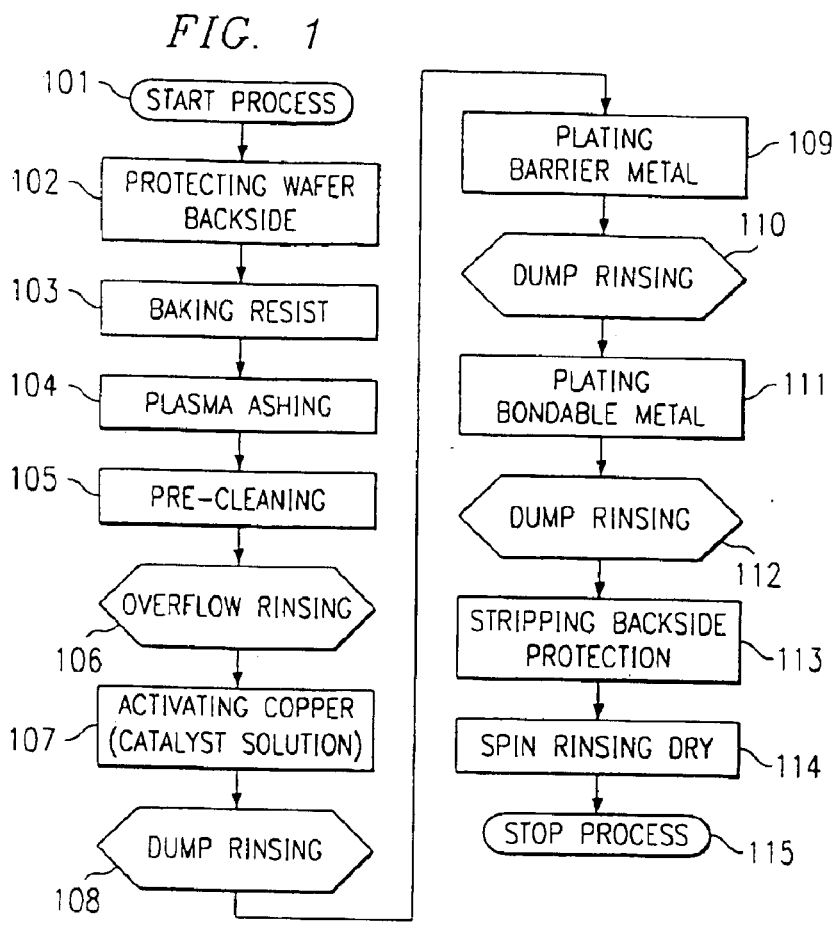
*Prior Art*
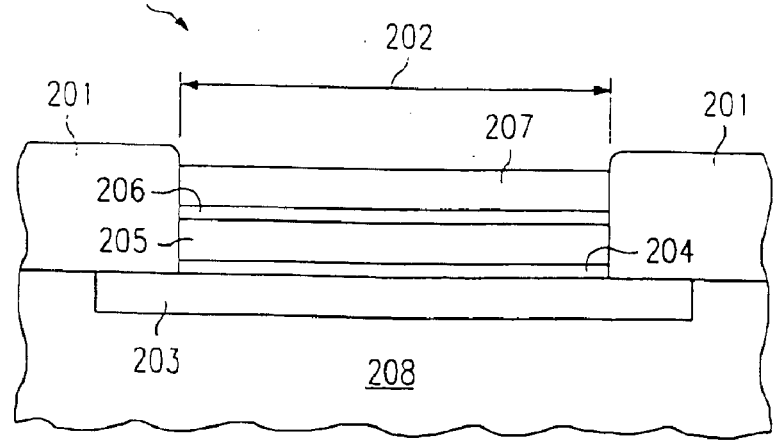

METHOD TO ACHIEVE CONTINUOUS HYDROGEN SATURATION IN SPARINGLY USED ELECTROLESS NICKEL PLATING PROCESS

Continuation of prior application Ser. No. 10/122,064 Apr. 15, 2002 now U.S. Pat. No. 6,616,967.

FIELD OF INVENTION

This invention relates to electroless nickel plating process and more particularly to a method to achieve continuous hydrogen saturation in sparingly used electroless nickel plating processes.

BACKGROUND OF INVENTION

In integrated circuits (IC) technology, pure or doped aluminum has been the metallization of choice for interconnection and bond pads. The main advantages of aluminum include easy deposition and patterning. Further, the technology of bonding wires made of gold, copper, or aluminum to the aluminum bond pads has developed to a high level of automation, miniaturization, and reliability.

In the continuing trend to miniaturize the ICs, the RC time constant of the interconnection between active circuit elements increasingly dominates the achievable IC speed-power product. Consequently, the relatively high resistivity of the interconnecting aluminum appears inferior to the lower resistivity of metals such as copper. Further, the pronounced sensitivity of aluminum to electromigration is becoming a serious obstacle to increased miniaturization. Consequently, there is now a strong drive in the semiconductor industry to employ copper as the preferred interconnecting metal, based on its higher electrical conductivity and lower electromigration sensitivity. From the standpoint of the mature aluminum interconnection technology, however, this shift to copper is a significant technological challenge.

Copper has to be shielded from diffusing into the silicon base material of the ICs in order to protect the circuits from the carrier lifetime killing characteristic of copper atoms positioned in the silicon lattice. For bond pads made of copper, the formation of thin copper (I) oxide films during the manufacturing process flow has to be prevented since these films severely inhibit reliable attachment of bonding wires, especially for conventional gold-wire thermosonic ball bonding. In contrast to aluminum oxide films overlying metallic aluminum, copper oxide films overlying metallic copper cannot easily be broken by a combination of thermocompression and ultrasonic energy applied in the bonding process. This means that the bond pad has to be cleaned to remove oxides immediately prior to bonding. This involves an additional process step and still carries the risk of too much time elapsing between cleaning and bonding in which case the bond may fail. As a further difficulty, bare copper bond pads are susceptible to corrosion. Copper oxide continues to grow with time. It is possible to bond through thin copper oxide.

Oxidation of aluminium, however, is self-limiting. That is after a monolayer of aluminium oxide forms, no further oxidation occurs. It is possible to bond through this oxide.

In order to overcome these problems, a process has been disclosed to cap the clean copper bond pad with a layer of aluminum and thus re-construct the traditional situation of an aluminum pad to be bonded by conventional gold-wire ball bonding. A suitable bonding process is described in U.S. Pat. No. 5,785, 236, issued on Jul. 28, 1998 (Cheung et al., "Advanced Copper Interconnect System that is Compatible with Existing IC Wire Bonding Technology"). The described approach, however, has several shortcomings.

First, the fabrication cost of the aluminum cap is higher than desired, since the process requires additional steps for depositing metal, patterning, etching, and cleaning. Second, the cap must be thick enough to prevent copper from diffusing through the cap metal and possibly poisoning the IC transistors. Third, there is a required barrier of TaN between the copper and aluminium to prevent migration. Fourth, the aluminum used for the cap is soft and thus gets severely damaged by the markings of the multiprobe contacts in electrical testing. This damage, in turn, becomes so dominant in the ever decreasing size of the bond pads that the subsequent ball bond attachment is no longer reliable.

A low-cost structure and method for capping the copper bond pads of copper-metallized ICs has been disclosed by Roger J. Stierman et al in U.S. patent application Ser. No. 09/775,322, filed on Feb. 18 ,2001 entitled "Structure and Method for Bond Pads of Copper Metallization. This application is incorporated herein by reference. An urgent need has arisen for a reliable method of bonding wires to capped bond pads which combines minimum fabrication cost with maximum up-diffusion control of metals potentially capable of impending subsequent wire bonding. A robust, reliable and low cost metal structure and process enabling electrical wire connections to the interconnecting copper metallization of integrated circuits is described in application Ser. No. 09/817,696 filed Mar. 23, 2001 and is entitled "Wire Bonding Process For Copper-Metallized Integrated Circuits" filed by Howard Test; Gonzalo Amador; and Willmar Subido. This application is incorporated herein by reference. The structure comprises a layer of barrier metal that resists copper diffusion in a thickness such that the barrier layer reduces the diffusion of copper at 250 degrees C. by more than 80% compared with the absence of barrier metal. The barrier metal is selected from a group consisting of nickel, cobalt, chromium, molybdenum, titanium, tungsten, and silver. The electroless process for fabricating the bond pad cap is illustrated in FIG. 2. The bond pads are opened in the protective overcoat by a process that takes place toward the end of the wafer fabrication that occurs in the wafer fab. This exposes the copper IC metallization in bond pad areas, the cap deposition process starts at 101; the sequence of process steps is as follows:

Step 102: Is an optional step of coating the backside of the silicon IC wafer with resist using a spin-on technique. This coat will prevent unwanted metal deposition on the wafer backside. This may not be necessary if the back side has SiO2 on it.

Step 103: Is an optional step of baking the resist, typically at 110 Degree C. for a time period of about 30 to 60 minutes.

Step 104: Is an optional step of cleaning of the exposed bond pad copper surface using a plasma ashing process for about 2 minutes. This need not be used by limiting the time when the wafer is completed in the wafer fab and plating.

Step 105: Cleaning by immersing the wafer, having the exposed copper of the bond pads, in a solution of sulfuric acid, nitric acids, or any other acid, for about 30 to 90 seconds. This is a cleaning process that removes organic contaminants from the surface of the bond pad and activates the surface with an acid etch using dilute acids.

Step 106: Rinsing in a dump rinse station for about 60 to 180 seconds.

Step 107: Immersing the wafer in a catalytic metal chloride solution, such as palladium chloride, for about 60 to 180 seconds "activates" the copper surface, i.e., a thin layer of seed metal (such as palladium) is deposited onto the clean, non-oxidized copper surface.

Step 108: Rinsing in a dump rinse station for about 60 to 180 seconds.

Step 109: Electroless plating of barrier metal against copper up-diffusion. If nickel is selected, plating between 60 to 180 seconds will deposit about 0.2 to 0.6 μm thick nickel. Other thickness barrier may be used depending on the application.

Step 110: Rinsing in a dump rinse station for about 60 to 180 seconds.

Step 111: Electroless plating of outermost layer, which is bondable and simultaneously provides a barrier against up-diffusion of the underlying barrier metal. If gold or palladium is selected, plating between 10 to 20 minutes will deposit about 0.1 to 0.2 um of palladium and 40 to 80 nm Au, respectively. The palladium process is an electroless process that plates at the rate of about 0.01 um per minute. The gold process is an immersion process that is self limiting at about 0.08 um at 8 to 12 minutes. A preferred process uses first an electroless palladium process for between 8 and 22 minutes to deposit 0.1 and 0.3 μm of palladium followed by an immersion gold plating process step with self-limiting surface metal replacement. If gold is selected, plating between 400 and 800 seconds will deposit approximately 40–80 nm of gold. As a second step for thicker metal layer (0.5 to 1.5 μm thick), the immersion process is followed by an autocatalytic process step.

Step 112: Rinsing in a dump rinse station for about 60 to 180 seconds.

Step 113: Optional step of stripping wafer backside protection resist for about 8 to 12 minutes. Only needs to be done if applied earlier.

Step 114: Spin rinsing and drying for about 6 to 8 minutes.

Electroless nickel plating requires that the plating bath be in a state of hydrogen saturation for optimum process performance. Some applications such as the above-described process incorporate many other process steps that exceed the time a nickel bath can remain in saturation without the presence of active plating. Current procedures require a preliminary plating process to be executed before processing each lot. The procedure requires 15 to 30 minutes to complete. This reduces the throughput and increases the cost of the total process.

SUMMARY OF INVENTION

In accordance with one embodiment of the present invention, a method to achieve continuous hydrogen saturation for providing a nickel barrier layer over the copper for wire bonding to copper metallized integrated circuits is provided by after the initial start up of the nickel bath, providing a small area of metal that remains in the nickel plating tank. This dummy specimen is plated continuously maintaining hydrogen saturation in the bath before the desired useful product wafer reaches the nickel plating tank.

DESCRIPTION OF DRAWING

FIG. 1 illustrates a block diagram of the process flow for fabricating the bond pad cap according to the prior art.

FIG. 2 illustrates a schematic cross section of an electroless nickel, electroless palladium, immersion gold bond pad cap.

DESCRIPTION OF PREFERRED EMBODIMENT OF THE PRESENT INVENTION

Figure 3A:
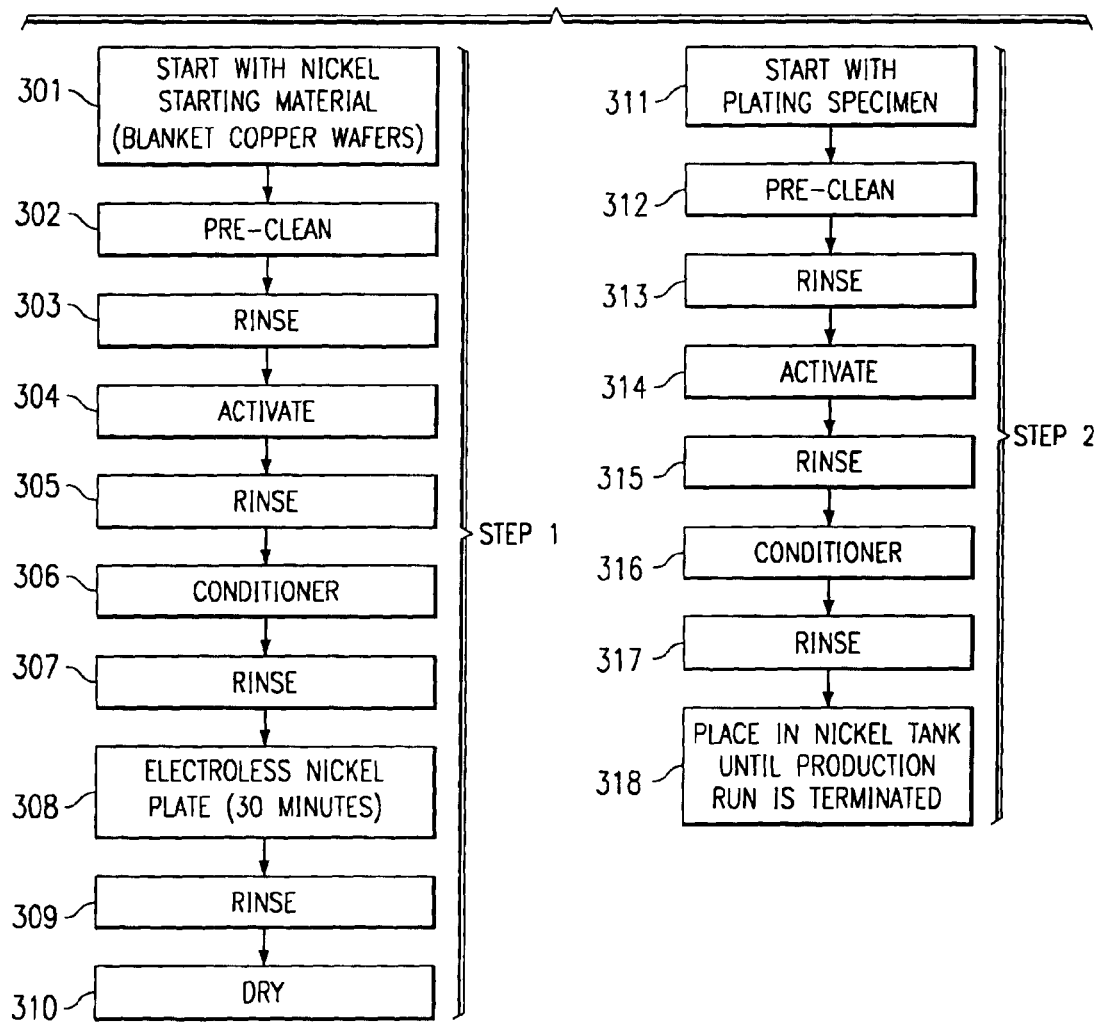
FIG. 3A illustrates Steps 1 and 2 and FIG. 3B illustrates Step 3 of the process flow for fabricating the bond pad cap according to the present invention.

In accordance with the present invention after an initial start up of the nickel bath, a small area of metal is put into and remains in the nickel plating tank. This small area of metal specimen is continuously plated so as to maintain hydrogen saturation in the bath.

Referring to FIG. 2, there is illustrated a cross section of the structure for metallurgical connections between metal wires and bond pads positioned on integrated circuits having copper interconnecting metallization. An integrated circuit (IC) has copper interconnecting metallization and is covered by a moisture-impenetrable protective coating 201. This overcoat is usually made of silicon nitride, silicon oxide or organic materials commonly 0.5 to 2.0 μm thick. A window 202 is opened in the overcoat in order to expose a portion of the copper metallization 203. Not shown in FIG. 2 is the underlayer 208 embedding the copper and preventing its diffusion into parts of the IC. Since bare copper is susceptible to corrosion and oxidation, making it difficult to bond, a cap 204-207 is formed over the exposed copper. Directly facing a cleaned and non-oxidized copper surface is a first layer 204 of seed material of palladium of approximately one atom thickness. Immediately following the seed material is a nickel layer 205 as a barrier against up-diffusing copper. On top of this layer is a palladium layer 206 as barrier against up-diffusing nickel. On top of the palladium layer is a gold layer 207 for bonding to the gold bond wires.

Figure 3B:
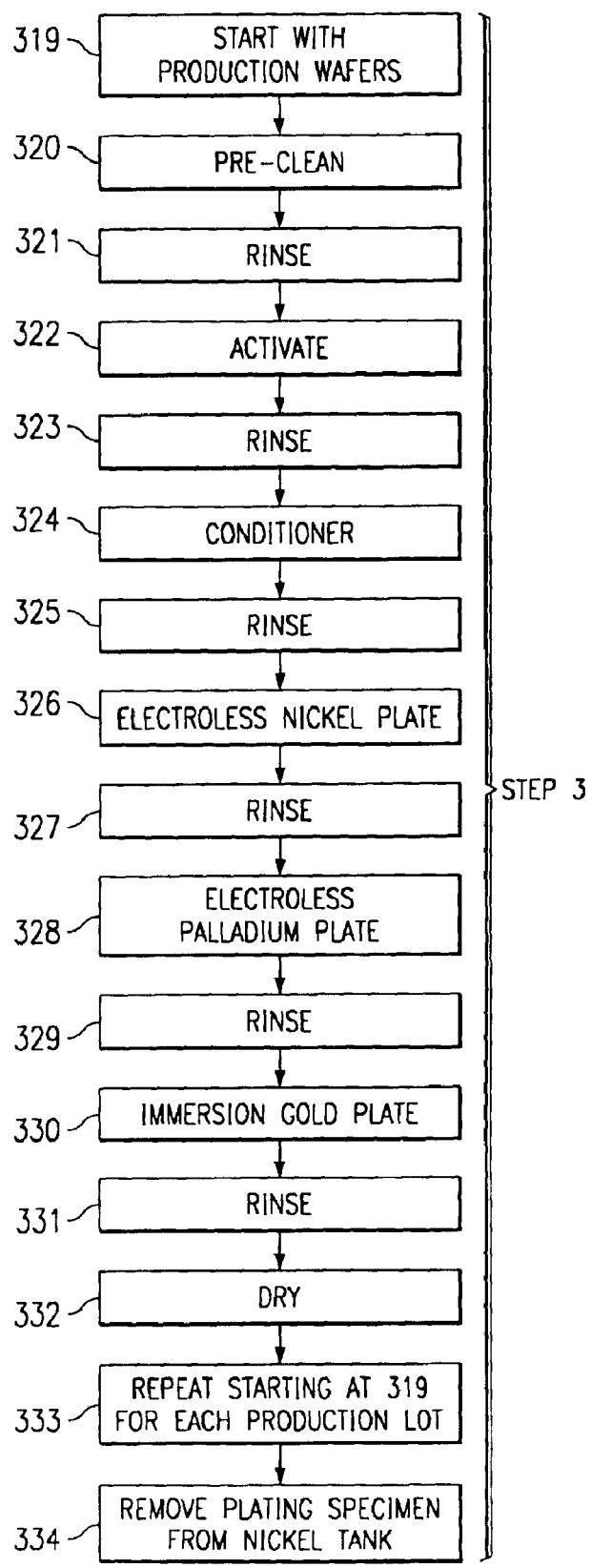

The plating process involves a series of tanks where the wafer or lot of wafers are put into and taken out of the tanks. In accordance with a preferred embodiment of the present invention illustrated in FIGS. 3A and 3B, the first Step 1 is to place a nickel plating bath into a state of hydrogen saturation by processing 1–4 wafers coated entirely on one side with copper metal. The step 1 process consists of the steps of Step 301 starting with nickel starting material (blanket copper wafers), Step 302 of pre-clean, Step 303 rinse, Step 304 activate, Step 305 rinse, Step 306 of applying a conditioner, Step 307 of rinse, Step 308 of electroless nickel plate for 15 to 30 minutes, Step 309 of rinse and Step 310 of spin dry. The steps of rinsing, pre-cleaning activating, conditioning are like that described above and to follow in the specification.

Following the process that establishes hydrogen saturation in the nickel bath, a plating specimen is prepared by Step 2. Step 2 starts with step of providing a plating specimen Step 311. The plating specimen is prepared by Sep 312 pre-clean, Step 313 rinse, Step 314 activate, Step 315 rinse, Step 316 conditioner, and Step 317 rinse. The specimen in Step 318 is placed in the nickel tank until production runs are terminated. The pre-cleaning, rinsing, activating and conditioning steps are like that described above and to follow in the specification. This specimen remains in the nickel bath where it is plated continuously which maintains the nickel bath in a state of hydrogen saturation. The specimen can be in one of several forms including copper metal, nickel metal, copper coated wafer. Hydrogen gas is generated during the electroless nickel plating process and is necessary for an efficient plating process. Since the reaction between the plated surface and the constituents of the plating bath change with changing degrees of hydrogen content, it is most advantageous to maintain the bath in a steady state of hydrogen saturation. This can be accomplished by continuously plating a sacrificial specimen. It is best that the area to be plated on the product be small compared to the area of the metal specimen. It is best that the area to be plated on the product compared to the area of the metal specimen be such that the introduction of the nickel plating from the wafers is not more than about a 2 to 10 percent increase in load so as not to shock the tank. The metal remains in the tank to maintain the hydrogen saturation in the tank for all processed lots.

After the nickel plating tank has been put into hydrogen saturation with the prepared specimen in the tank, the production processing follows Step 3. The Step 3 begins with providing the production wafers at step 319. The production wafer process may be like that in steps 102 through 114 in FIG. 1. Steps 102 and 103 are not required as long as the backside, edge and the front side exclusion zone are oxide coated. Step 104 is optional depending on the elapsed time between the exposure of the copper in the bond pads and the process of plating the pads. A plasma clean on all wafers may be used. In accordance with applicant's preferred embodiment a plasma clean is not used for normal production. It will be used only when a long time (for example 20 days ?) passes between fab out and plating. In step 111 according to a preferred embodiment herein the electroless plating requires about 16–26 minutes to deposit 0.2 μm of palladium. Immersion plating deposits about 80 nm of gold on palladium in about 8 to 12 minutes. Times vary depending on the underlying metal and process conditions. A preferred process uses first an electroless process to plate palladium for between 8 and 36 minutes to deposit between 0.1 and 0.3 um of palladium followed by an immersion gold plating process step with self-limiting surface metal replacement. If gold is selected, plating between 8 and 12 minutes will deposit approximately 40–80 nm of gold. As a second step for thicker metal layer (0.5 to 1.5 μm thick), the immersion process is followed by an autocatalytic gold process step.

The production wafer process of Step 3 may be like that in Steps 319 through 333 in FIG. 3 after the initial start up of in Step 1 of Steps 301 through 310 of placing the nickel plating tank into hydrogen saturation and the Step 2 of plating specimen in the tank to maintain hydrogen saturation with steps 311 through 318. The wafer process Step 3 begins Step 319 of providing production wafers Step 319, a pre-clean Step 320 using Duraprep BP 54 for 90 seconds at 43 degrees C. This is a surface conditioner. The pre-clean process cleans the wafers to remove the oxide. At the next Step 321 is a quick dump rinse with DI water for 110 seconds at 23 degrees C. After this is a surface activation Step 322 where a single atom layer of palladium is placed on the copper so it can have an active surface so the nickel will plate onto that surface. This activation step uses, for example, Ronamrse Catalyst CF for 120 seconds at 30 degrees C. The surface is activated by a palladium layer. This palladium Step 322 creates energy on the surface that will attract the nickel. This takes 90–120 seconds. The next Step 323 is a rinse. The Step 324 applies a conditioner such as Ronamerse BP conditioner for 60 seconds at 23 degrees C. to remove ionic Pd. After this in Step 325 is another quick dump rinse. The next step 326 is to place the wafers into the prepared nickel bath or tank using for example Everon BP wherein the bath is in hydrogen saturation (because of Steps 302 through 318) for 120 seconds at 85 degrees C. The nickel plating is 0.3–0.5 μm thick. This is followed by two quick dump rinses (Step 327 of DI water with each for 90 seconds at 23 degrees C.). The next Step 328 is to palladium plate using Pallamerse BP for 720 seconds at 65 degrees C. to put on a 0.2 μm thick layer. The next Step 329 is a quick dump rinse of DI water for 110 seconds at 60 degrees C. The next Step 330 is immersion in a gold tank using Aurolectroless BP for 720 seconds at 85 degrees C. to put on a layer of 800 Angstroms gold for good adhesion to the gold balls on the end of the gold bond wires. This is followed by another quick dump rinse (Step 331) of DI water for 110 seconds at 60 degrees C. The wafers are then spin dried in Step 332. For more wafers (Step 333) repeat Steps 319 through 333 keeping the metal specimen such as copper in the nickel plating tank.

When the bond cap fabrication process for all lots is completed then remove the specimen from the nickel plating tank.

Figure 4:
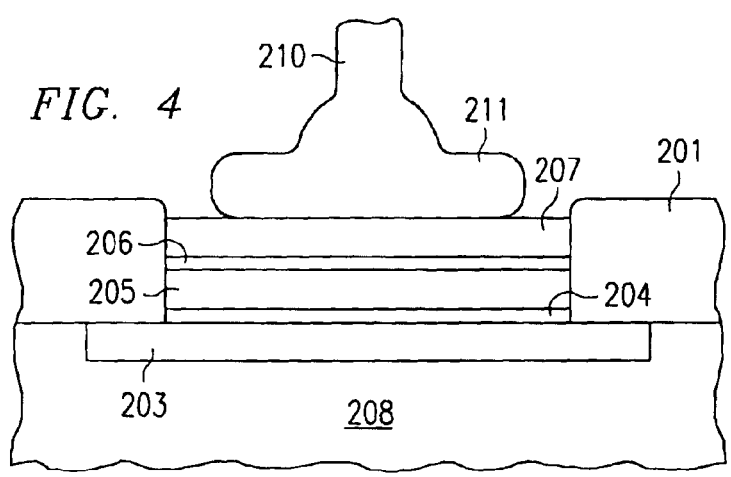
FIG. 4 illustrates a wire bond ball on the cap of FIG. 2.

The wire bonding process begins by positioning both the IC chip with the bond pads and the object, to which the chip is to be bonded, on a heated pedestal to raise their temperature to between 100 and 250 degrees C. Referring to FIG. 4 a wire 210 typically of gold, gold-beryllium alloy, other gold alloy having a diameter ranging from 18 to 33 μm is threaded through a capillary. At the tip of the wire extending from the capillary, a free air ball 211 is created using a flame or a spark technique. The ball 211 has a typical diameter from about 1.2 to 1.6 wire diameters. The capillary is moved towards the chip bonding pad at layer 207. A combination of compression force, heat and ultrasonic energy creates the formation of a strong metallurgical bond by metal interdiffusion. At time of bonding, the temperature usually ranges from 100–250 degrees C.

The specific materials Ronamrse BP, Aurolectroless BP, Pallamerse BP, Everon BP, and Duraprep BP 54 are Shipley Ronal products of 272 Buffalo Avenue, Freeport, N.Y. 11520.

While this invention has been described in reference to illustrative embodiments, this description is not intended to be construed in a limiting sense. Various modification and combinations of the illustrative embodiments, and combinations of the illustrative embodiments, as well as other embodiments of the invention, will be apparent to persons skilled in the art upon reference to the description.

What is claimed is:

1. A method for electroless plating of a semiconductor wafer, comprising the steps of:

providing a plating bath;

establishing a state of hydrogen saturation in the bath by immersing a metal specimen in the bath;

immersing the semiconductor wafer in the hydrogen saturated bath.

2. The method of claim 1, wherein said step of immersing a metal specimen in the bath comprises immersing a metal plate in the bath.

3. The method of claim 1, wherein the step of immersing a metal specimen in the bath comprises immersing a metal coated semiconductor wafer in the bath.

4. The method of claim 1, wherein the metal specimen is copper.

5. The method of claim 1, wherein the step of providing a plating bath comprises providing a nickel plating bath.

6. The method of claim 1, wherein the semiconductor wafer includes a patterned copper metal layer on one of the surfaces of the wafer.

7. The method of claim 1, wherein the metal specimen remains in the bath after the step of immersing the semiconductor wafer in the bath.

* * * * *